United States Patent
Saito

(10) Patent No.: US 10,622,288 B2
(45) Date of Patent: Apr. 14, 2020

(54) SEMICONDUCTOR DEVICE AND METHOD FOR PRODUCING SEMICONDUCTOR DEVICE

(71) Applicant: ROHM CO., LTD., Kyoto-shi, Kyoto (JP)

(72) Inventor: Koshun Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/178,265

(22) Filed: Nov. 1, 2018

(65) Prior Publication Data

US 2019/0139873 A1    May 9, 2019

(30) Foreign Application Priority Data

Nov. 6, 2017 (JP) ................... 2017-213845
Nov. 6, 2017 (JP) ................... 2017-213846
Oct. 31, 2018 (JP) ................... 2018-204913

(51) Int. Cl.
*H01L 23/495* (2006.01)
*H01L 21/56* (2006.01)
(Continued)

(52) U.S. Cl.
CPC .... *H01L 23/49562* (2013.01); *H01L 21/4825* (2013.01); *H01L 21/56* (2013.01); *H01L 23/3121* (2013.01); *H01L 23/49503* (2013.01); *H01L 23/49517* (2013.01); *H01L 23/49524* (2013.01); *H01L 24/40* (2013.01); *H01L 24/32* (2013.01); *H01L 24/73* (2013.01); *H01L 2224/32245* (2013.01);
(Continued)

(58) Field of Classification Search
CPC ......... H01L 23/49562; H01L 23/49503; H01L 23/488; H01L 21/4825; H01L 23/495; H01L 23/49517
See application file for complete search history.

(56) References Cited

U.S. PATENT DOCUMENTS 9,978,672 B1 * 5/2018 Ahlers ................. H02M 7/003
2012/0074546 A1 * 3/2012 Chong ................. H01L 21/561
257/676

(Continued)

FOREIGN PATENT DOCUMENTS

JP 2005277231 A 10/2005
JP 2009071033 A  4/2009

*Primary Examiner* — Changhyun Yi
(74) *Attorney, Agent, or Firm* — Hamre, Schumann, Mueller & Larson, P.C.

(57) ABSTRACT

A semiconductor device includes a semiconductor element, leads, and an encapsulation resin covering a portion of each of the leads and the semiconductor element. Each of the leads includes an external connection portion projecting from a side surface of the encapsulation resin. The external connection portion of at least one of the leads has opposite ends in a width-wise direction that extends along the side surface of the encapsulation resin. The external connection portion includes two recesses arranged toward a center in the width-wise direction from the opposite ends. The two recesses extend from a distal surface toward the encapsulation resin. The opposite ends in the width-wise direction define an end connection part. The external connection portion includes a part between the two recesses defining a center connection part.

23 Claims, 13 Drawing Sheets

(51) Int. Cl.
*H01L 21/48* (2006.01)
*H01L 23/00* (2006.01)
*H01L 23/31* (2006.01)

(52) U.S. Cl.
CPC .............. *H01L 2224/37124* (2013.01); *H01L 2224/37147* (2013.01); *H01L 2224/37611* (2013.01); *H01L 2224/37639* (2013.01); *H01L 2224/37655* (2013.01); *H01L 2224/40175* (2013.01); *H01L 2224/73263* (2013.01); *H01L 2924/1203* (2013.01)

(56) References Cited

U.S. PATENT DOCUMENTS

2018/0301444 A1* 10/2018 Roth .................... H01L 23/3735
2018/0358287 A1* 12/2018 Wong .................. H01L 21/4825

* cited by examiner

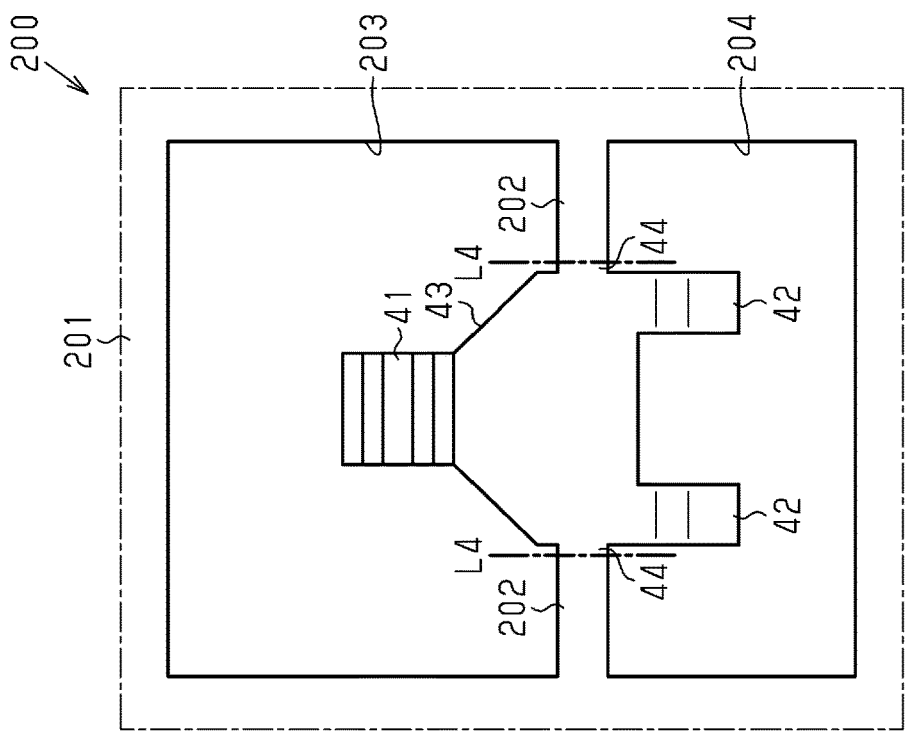
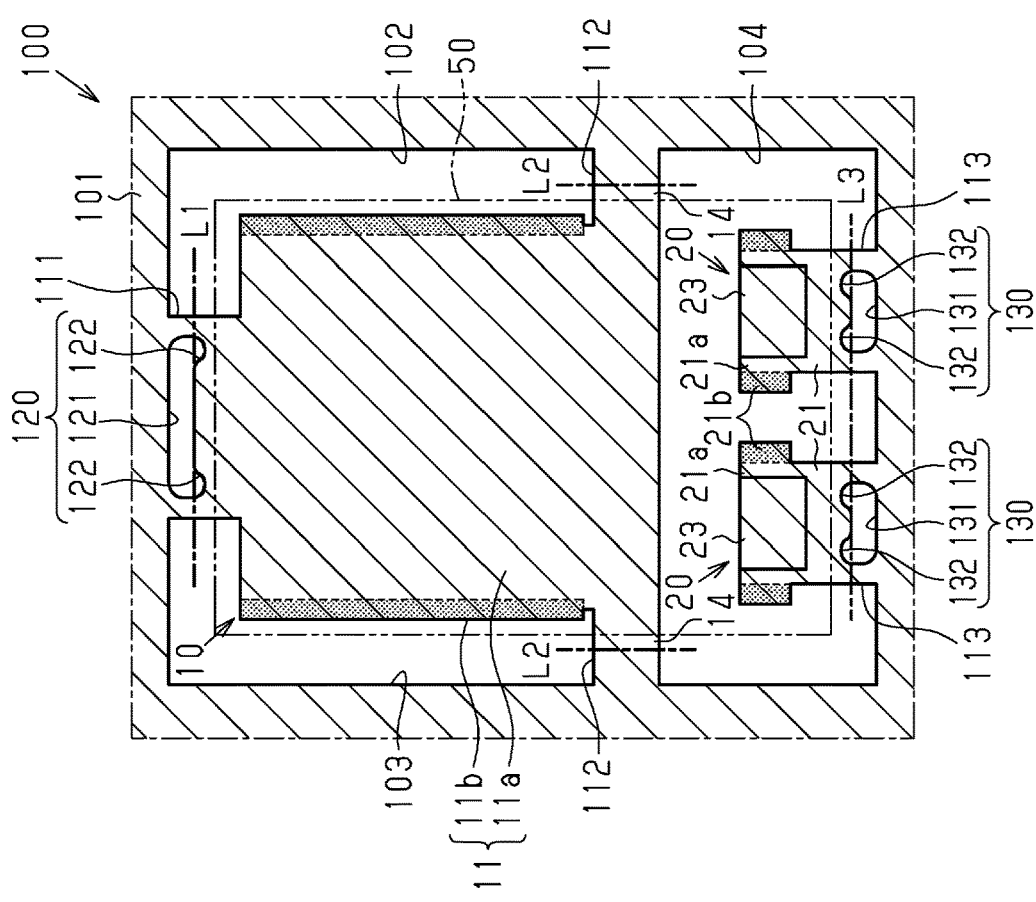

SEMICONDUCTOR DEVICE AND METHOD FOR PRODUCING SEMICONDUCTOR DEVICE

BACKGROUND OF INVENTION

The present invention relates to a semiconductor device and a method for producing a semiconductor device.

When a typical semiconductor device includes a semiconductor element such as a transistor or a diode, the semiconductor device includes a lead connected to the semiconductor element and an encapsulation resin encapsulating the semiconductor element (refer to, for example, Japanese Laid-Open Patent Publication No. 2009-71033). The lead of the semiconductor device is connected to, for example, a pad of a circuit board by solder.

When a semiconductor device is mounted on a circuit board, solder may be insufficient to connect a lead of the semiconductor device to a pad of the circuit board. Insufficient solder may result in an insufficient strength to mount the semiconductor device.

SUMMARY OF INVENTION

It is an object of the present invention to improve the mount strength.

One aspect of the present disclosure is a semiconductor device that includes a semiconductor element, leads, and an encapsulation resin covering a portion of each of the leads and the semiconductor element. Each of the leads includes an external connection portion projecting from a side surface of the encapsulation resin. The external connection portion of at least one of the leads has opposite ends in a width-wise direction that extends along the side surface of the encapsulation resin. The external connection portion includes two recesses arranged toward a center in the width-wise direction from the opposite ends. The two recesses extend from a distal surface of the external connection portion toward the encapsulation resin. The opposite ends in the width-wise direction define an end connection part. The external connection portion includes a part between the two recesses defining a center connection part.

Another aspect of the present disclosure is a method for producing a semiconductor device that encapsulates a semiconductor element and a portion of each of leads with a resin. The method includes steps of preparing a lead frame that form the leads, forming an encapsulation resin covering a portion of each of the leads and a semiconductor element mounted on the lead frame, and forming an external connection portion that projects from a side surface of the encapsulation resin by cutting the leads. The leads are connected to a frame portion of the lead frame by a frame connector that forms the external connection portion. The frame connector includes a first through hole extending in a width-wise direction and second through holes extending from opposite ends of the first through hole away from the frame portion. In the forming an external connection portion, the frame connector is cut across the first through hole so that the external connection portion is formed to have opposite ends in a width-wise direction that extends along a side surface of the encapsulation resin and include two recesses. The two recesses are arranged toward a center in the width-wise direction from the opposite ends and extend from a distal surface of the external connection portion toward the encapsulation resin. The opposite ends of the external connection portion in the width-wise direction define an end connection part. The external connection portion includes a part between the two recesses defining a center connection part.

Another aspect of the present disclosure is a semiconductor device that includes a first lead including a die pad and an external connection portion, a second lead including an internal connection portion and an external connection portion, a semiconductor element mounted on the die pad, and a connection plate electrically connecting the semiconductor element and the second lead. The connection plate includes an element connector connected to the semiconductor element, a lead connector connected to the second lead, and a joint joining the element connector and the lead connector. The second lead includes a restriction portion connected to the lead connector and including restriction surfaces. The restriction portion restricts movement of the connection plate with the restriction surfaces.

BRIEF DESCRIPTION OF THE DRAWINGS

FIG. 9 is a partially plan view of a lead frame including leads.

FIG. 10 is a partially plan view of a lead frame including a clip.

DETAILED DESCRIPTION OF THE PREFERRED EMBODIMENTS

Figure 2:
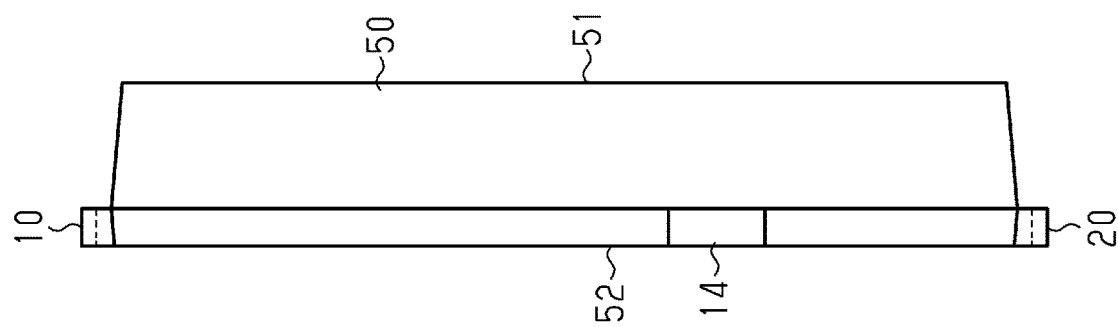
FIG. 2 is a schematic side view of the semiconductor device.

Each embodiment will now be described.

Elements in the drawings may be partially enlarged for simplicity and clarity and thus have not necessarily been drawn to scale. For the sake of clarity, hatching lines may not be shown in the cross-sectional drawings.

Figure 1:
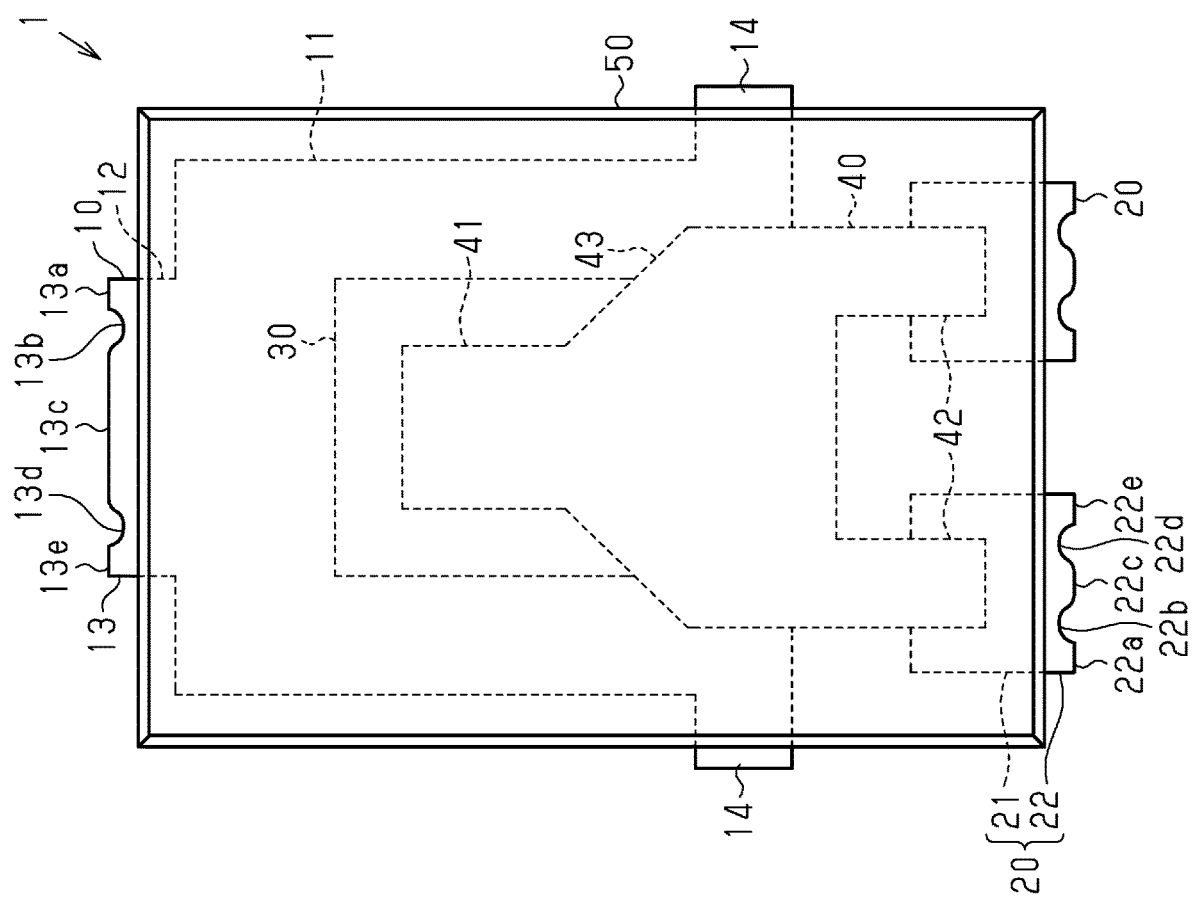
FIG. 1 is a schematic plan view of a semiconductor device.
Figure 3:
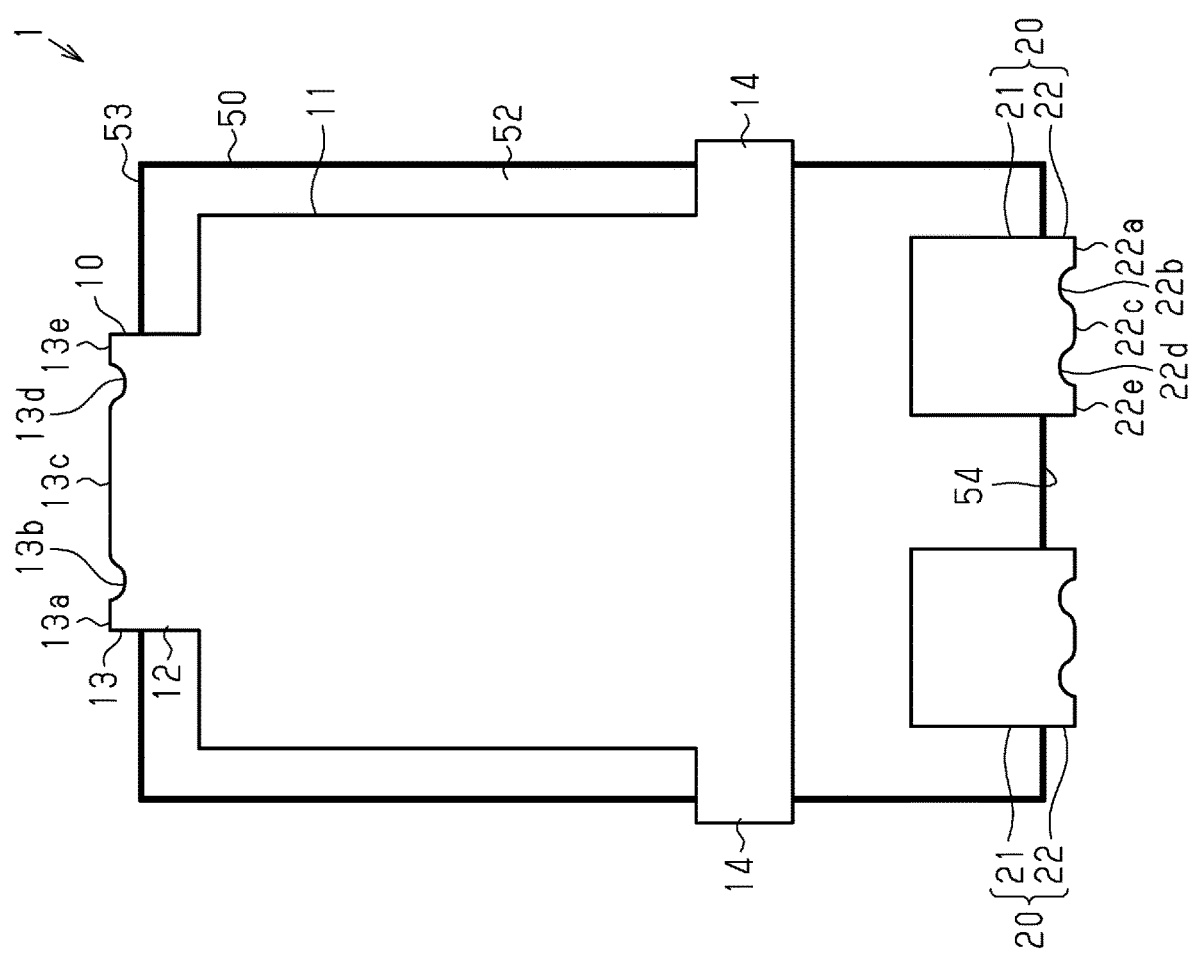
FIG. 3 is a schematic bottom view of the semiconductor device.

As shown in FIGS. 1, 2, and 3, a semiconductor device 1 is shaped as a rectangular plate.

The semiconductor device 1 includes a first lead 10, a second lead 20, a semiconductor element 30, a connection plate 40 (clip), and an encapsulation resin 50. The semiconductor device 1 of the present embodiment includes multiple (two in FIG. 1) second leads 20.

The semiconductor element 30 is mounted on the upper surface of the first lead 10. The semiconductor element 30 is, for example, a diode and has an upper surface and a lower surface, each of which includes an electrode. The electrode arranged on the lower surface of the semiconductor element 30 is electrically connected to the upper surface of the first lead 10 by solder 71 (refer to FIGS. 6 and 8), which will be described later. The electrode arranged on the upper surface of the semiconductor element 30 is electrically connected to the second leads 20 by the clip 40. Portions of the first lead 10 and the second leads 20, the semiconductor element 30, and the clip 40 are covered with the encapsulation resin 50.

The encapsulation resin 50 is shaped as a rectangular plate. The material of the encapsulation resin 50 may be an insulative resin, for example, an epoxy resin.

As shown in FIG. 2, the encapsulation resin 50 includes an upper surface 51 and a lower surface 52. The lower surface 52 is opposed to a circuit board when mounted. As shown in FIG. 3, the first lead 10 and the second leads 20 are exposed from the lower surface 52 of the encapsulation resin 50. The first lead 10 and the second leads 20 each have a surface exposed from the encapsulation resin 50 defining a mount surface. When mounted on the circuit board, the mount surface is electrically connected to a pad of the circuit board by solder.

As shown in FIG. 1, the encapsulation resin 50 has a side surface 53 on a first end (upper end in FIG. 1) and a side surface 54 on a second end (lower end in FIG. 1) that is opposite to the first end. The first lead 10 projects from the side surface 53, and the second leads 20 project from the side surface 54. The two second leads 20 are arranged along the side surface 54 of the encapsulation resin 50.

The first lead 10 includes an element mount 11 (die pad) having the form of a rectangular plate and a connection portion 12 extending from the die pad 11. The semiconductor element 30 is mounted on the upper surface of the die pad 11. The connection portion 12 has a distal part (upper end in FIG. 1) projecting from the encapsulation resin 50. The part projecting from the encapsulation resin 50 is an external connection portion 13 having a distal surface, to which solder adheres when the semiconductor device 1 is connected to the circuit board. The first lead 10 of the present embodiment includes tie bars 14 extending from the die pad 11. Each tie bar 14 has a distal end projecting from a side surface of the encapsulation resin 50.

Each second lead 20 is shaped as a rectangular plate. The second lead 20 includes an internal connection portion 21 covered with the encapsulation resin 50 and an external connection portion 22 projecting from the encapsulation resin 50. The internal connection portion 21 is connected to the semiconductor element 30 by the clip 40, which is described above. In the same manner as the external connection portion 13 of the first lead 10, the external connection portion 22 has a distal surface to which solder adheres when the semiconductor device 1 is connected to the circuit board.

Figure 4:
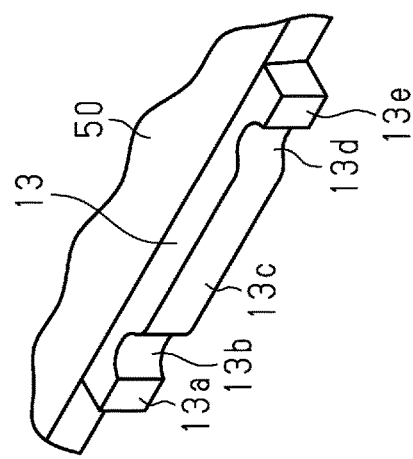
FIG. 4 is a partially perspective view of the semiconductor device showing a lead.

As shown in FIGS. 1, 3, and 4, the external connection portion 13 of the first lead 10 has the form of a rectangular plate extending along the side surface 53 of the encapsulation resin 50. The external connection portion 13 includes recesses 13b and 13d extending toward the encapsulation resin 50. The recesses 13b and 13d are arranged toward a center from opposite ends of the external connection portion 13 in a width-wise direction that extends along the side surface 53 of the encapsulation resin 50. Because of the recesses 13b and 13d, the external connection portion 13 includes end connection parts 13a and 13e located at opposite ends in the width-wise direction, the recesses 13b and 13d located toward the center from the end connection parts 13a and 13e, and a center connection part 13c located between the recesses 13b and 13d. It is preferred that the widths of the end connection parts 13a and 13e be less than half (½) of the width of the center connection part 13c. It is preferred that the depths (dimensions from the distal end of the external connection portion 13 toward the encapsulation resin 50) of the recesses 13b and 13d be approximately half (approximately ½) of the dimension of the external connection portion 13 (dimension from the encapsulation resin 50 toward the distal end of the external connection portion 13).

As shown in FIGS. 1 and 3, in the same manner as the first lead 10, the external connection portion 22 of each second lead 20 includes end connection parts 22a and 22e, recesses 22b and 22d, and a center connection part 22c.

The entire surface of the first lead 10 is substantially covered with a plating layer. Also, the entire surface of the second leads 20 is substantially covered with a plating layer. The first lead 10 and the second leads 20 are obtained by integrally plating a lead frame 100 (refer to FIG. 9), which will be described later, and cutting the lead frame 100. The plating layer covers surfaces excluding cut surfaces and surfaces covered with a plating mask. The cut surfaces are, for example, an end surface of each of the end connection parts 13a and 13e of the first lead 10, an end surface of each tie bar 14, and the end connection parts 22a and 22e of the second leads 20. In the present embodiment, the plating layer is formed on a side surface of each of the recesses 13b and 13d and a side surface of the center connection part 13c of the first lead 10 and a side surface of each of the recesses 22b and 22d and a side surface of the center connection part 22c of each second lead 20. In the present embodiment, the end surfaces of the end connection parts 13a, 13e, 22a, and 22e and the tie bars 14 may be partially covered with a plating layer by a cutting process.

The material of the first lead 10 and the second leads 20 may be a conductive metal, for example, copper (Cu), a Cu alloy, nickel (Ni), a Ni alloy, or Alloy 42. The material of the plating layer may be, for example, silver (Ag), nickel (Ni), tin (Sn), or an alloy including these. Multiple plating layers may be used.

The internal structure of the semiconductor device 1 will now be described.

Figure 5:
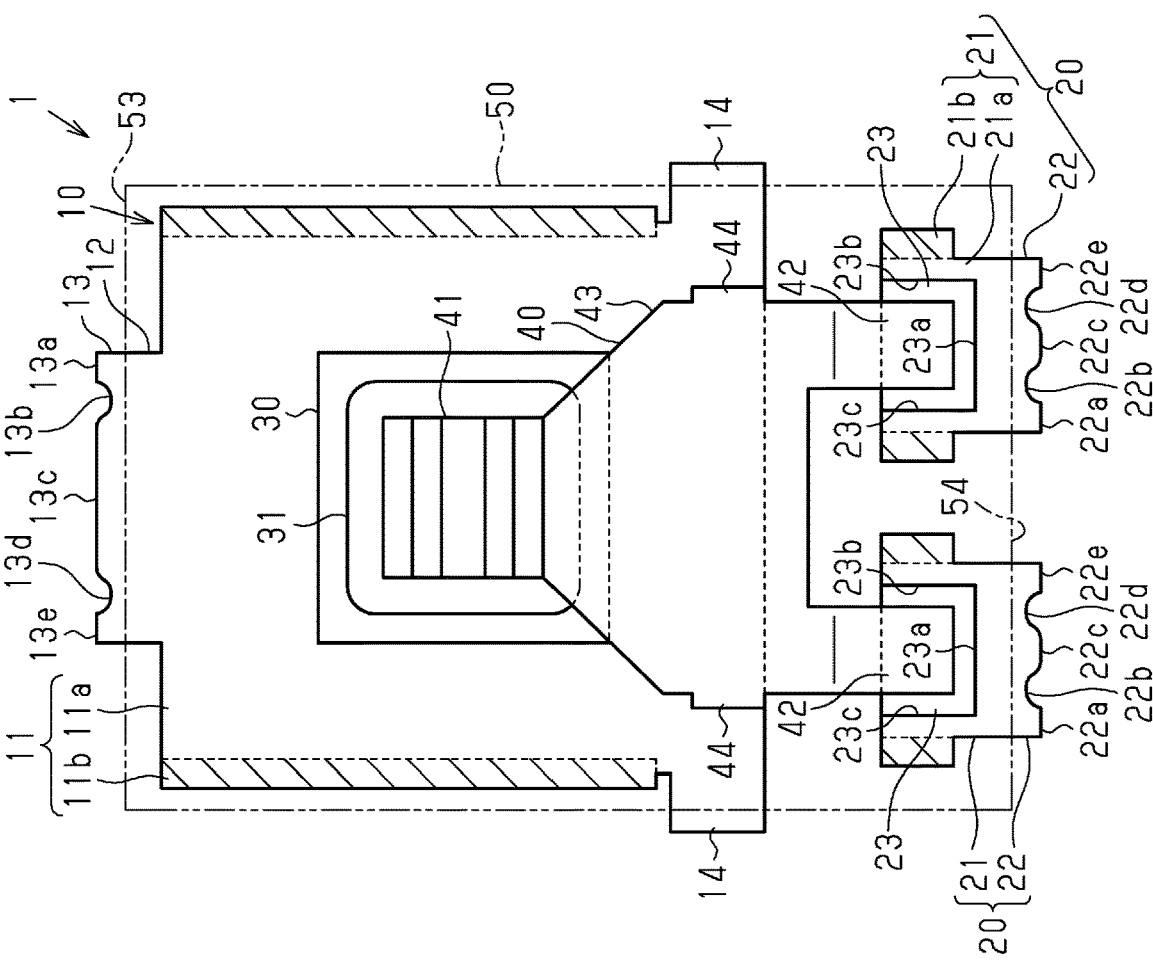
FIG. 5 is a plan view showing an internal structure of the semiconductor device.

As shown in FIG. 5, the die pad 11 of the first lead 10 includes a base 11a and flanges 11b located at opposite sides (left and right sides in FIG. 5) of the base 11a. In FIG. 5, for the sake of clarity, hatching lines are given to the flanges 11b. The flanges 11b are thinner than the base 11a. The upper surfaces of the flanges 11b are substantially flush with the upper surface of the base 11a. Thus, the flanges 11b are not exposed from the lower surface 52 of the encapsulation resin 50. More specifically, the encapsulation resin 50 embeds the flanges 11b. This limits separation of the first lead 10 from the encapsulation resin 50. In FIG. 5, the encapsulation resin 50 is indicated by imaginary lines (double-dashed lines). The same indication is used in the drawings described below.

The internal connection portion 21 of each second lead 20 includes a base 21a and flanges 21b located at opposite sides (left and right sides in FIG. 5) of the base 21a. In FIG. 5, for the sake of clarity, hatching lines are given to the flanges 21b. In the same manner as the flanges 11b of the die pad 11 of the first lead 10, the flanges 21b are thinner than the base 21a. Thus, the encapsulation resin 50 embeds the flanges 21b. This limits separation of the second leads 20 from the encapsulation resin 50.

Figure 6:
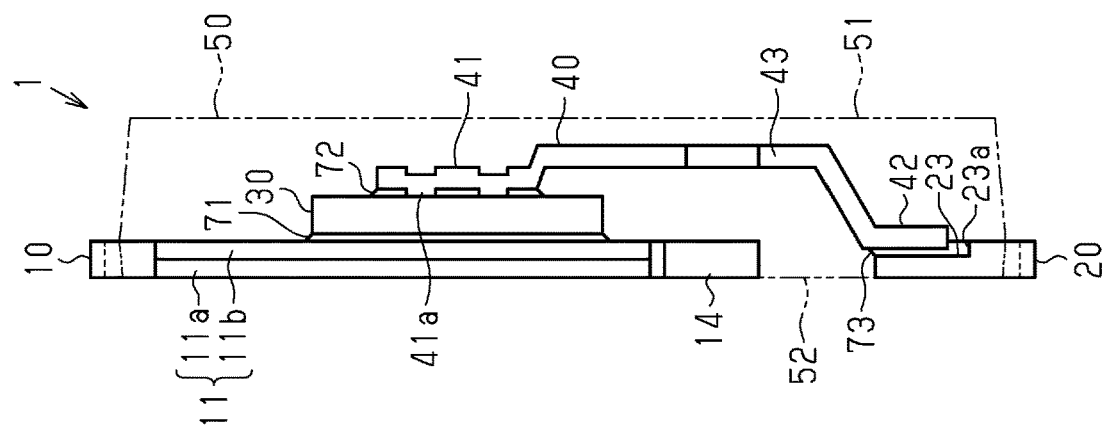
FIG. 6 is a side view showing an internal structure of the semiconductor device.

As shown in FIGS. 5 and 6, each second lead 20 includes a connection recess 23 used as a restriction portion. The connection recess 23 is obtained by recessing the upper surface of the internal connection portion 21 of the second lead 20. As shown in FIG. 6, in the present embodiment, the connection recess 23 is open at the side opposed to the die pad 11 of the first lead 10. As shown in FIG. 5, the connection recess 23 of the second lead 20 is defined by a first restriction surface 23a facing the die pad 11 of the first lead 10 and second restriction surfaces 23b and 23c opposed to each other in a direction parallel to the first restriction surface 23a.

As shown in FIGS. 5 and 6, the clip 40 is a connection plate obtained by bending a conductive plate. The clip 40 includes an element connector 41 connected to the semiconductor element 30, lead connectors 42 connected to the respective second leads 20, and a joint 43 joining the element connector 41 and the lead connectors 42.

In the present embodiment, the semiconductor device 1 includes the two second leads 20. Thus, the clip 40 includes two lead connectors 42 corresponding to the two second leads 20. The joint 43 joins the one element connector 41 and the two lead connectors 42. In the present embodiment, the clip 40 includes two tie bars 44 extending from the joint 43.

Figure 8:
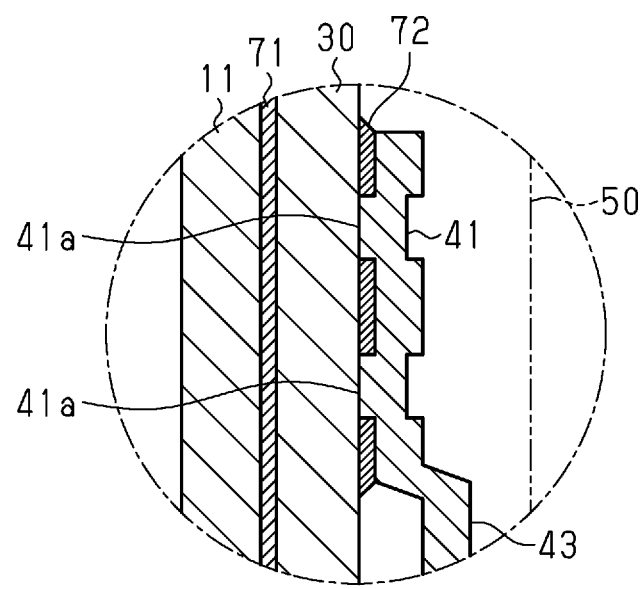
FIG. 8 is a partially enlarged view showing connection of a semiconductor element and a clip.

As shown in FIG. 8, the element connector 41 is connected to an electrode 31 of the semiconductor element 30 by solder 72. The element connector 41 is rectangular. The element connector 41 includes projections 41a. The element connector 41 may include at least one projection 41a.

The projections 41a are protrusions extending in the width-wise direction (sideward direction in FIG. 5) of the element connector 41. As shown in FIG. 8, the projections 41a define gaps between the element connector 41 and the semiconductor element 30. The solder 72 is applied between the element connector 41 and the semiconductor element 30 to fill the gaps so that the element connector 41 and the semiconductor element 30 are connected to each other by the solder 72.

Figure 7:
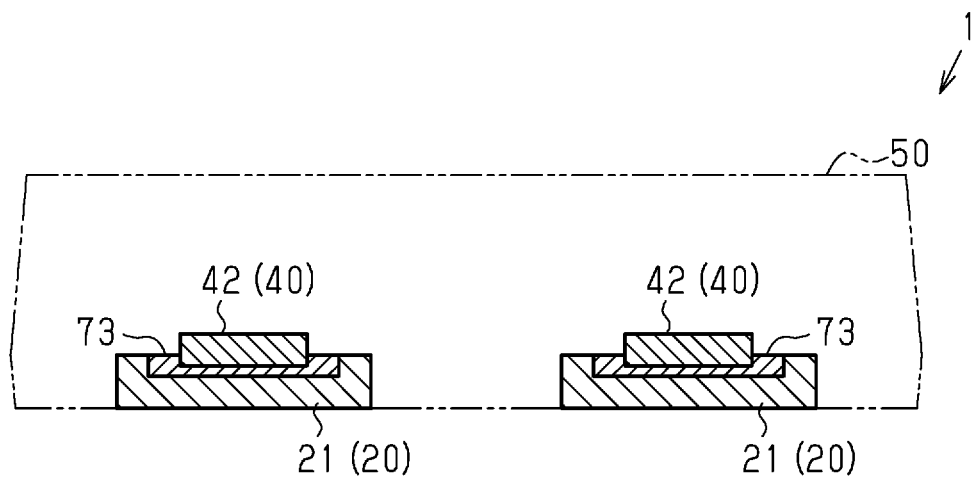
FIG. 7 is a cross-sectional view showing connection of a lead and a clip.

As shown in FIGS. 5, 6, and 7, the lead connectors 42 of the clip 40 are arranged in the connection recesses 23 of the second leads 20. Each lead connector 42 is shaped as a rectangular plate. The lead connector 42 is opposed to the first restriction surface 23a and the second restriction surfaces 23b and 23c defining the corresponding one of the connection recesses 23. As shown in FIGS. 6 and 7, the lead connectors 42 are connected to the connection recesses 23 by solder 73.

The material of the clip 40 may be, for example, Cu, aluminum (Al), a Cu alloy, or an Al alloy. In the same manner as the first lead 10 and the second leads 20, the entire surface of the clip 40 is substantially covered with a plating layer. The material of the plating layer may be, for example, silver (Ag), nickel (Ni), tin (Sn), or an alloy containing these. Multiple plating layers may be used. In the same manner as the first lead 10 and the second leads 20, portions that are not covered with a plating layer are cut surfaces (entire or partial) that are obtained when the lead frame is cut.

The steps of producing the semiconductor device 1 of the present embodiment will now be described.

In the description of the producing steps, the same reference characters are given to those elements that ultimately become the corresponding members that are described above.

As shown in FIG. 9, the lead frame 100 includes a frame portion 101 and the first lead 10 and the second leads 20 supported by the frame portion 101. The base material of the lead frame 100 includes, for example, copper (Cu).

The lead frame 100 is formed by machining a metal plate (copper plate) having a predetermined thickness. The metal plate is, for example, punched so that through holes 102, 103, and 104 are formed in the metal plate to form the frame portion 101, the first lead 10, the second leads 20. Then, for example, pressing is performed so that the flanges 11b and 21b are formed in the die pad 11 of the first lead 10 and the internal connection portions 21 of the second leads 20. Additionally, for example, pressing is performed so that the connection recesses 23 are formed in the internal connection portions 21 of the second leads 20. In FIG. 9, oblique hatching lines are used for clarity of the lead frame 100. Also, discrete dot hatching is used for clarity of the flanges 11b and 21b.

The die pad 11 of the first lead 10 is connected to the frame portion 101 via a frame connector 111 and tie bars 112. The external connection portion 13 of the first lead 10 is obtained by cutting the frame connector 111 along a cutting line L1. The tie bars 14 of the first lead 10 are obtained by cutting the tie bars 112 along cutting lines L2. The internal connection portions 21 of the second leads 20 are connected to the frame portion 101 via frame connectors 113. The external connection portions 22 of the second leads 20 are obtained by cutting the frame connectors 113 along a cutting line L3.

A through hole 120 extends through the frame connector 111. The through hole 120 is formed by, for example, a punching process. The through hole 120 includes a first through hole 121 extending in the width-wise direction of the frame connector 111 (direction along the cutting line L1) and second through holes 122 extending from opposite ends of the first through hole 121 toward the die pad 11. The first through hole 121 is formed so that the portion between the two second through holes 122 will not be cut by cutting along the cutting line L1. The cutting along the cutting line L1 across the through hole 120 obtains the external connection portion 13 of the first lead 10. More specifically, the first through hole 121 and the second through holes 122 define the center connection part 13c and the recesses 13b and 13d, which are shown, for example, in FIG. 1.

In the same manner, a through hole 130 extends through each frame connector 113. The through hole 120 includes a first through hole 131 extending in the width-wise direction of the frame connector 113 (direction along the cutting line L3) and second through holes 132 extending from opposite ends of the first through hole 131 toward the internal connection portion 21. The first through hole 131 is formed so that the portion between the two second through holes 132 will not be cut by cutting along the cutting line L3. The cutting along the cutting line L3 across the through hole 130 obtains the external connection portion 22 of the second lead 20. More specifically, the first through hole 131 and the second through holes 132 define the center connection part 22c and the recesses 22b and 22d, which are shown in, for example, FIG. 1.

A plating layer is formed on the entire surface of the lead frame 100 by a plating process. More specifically, the platting layer is formed on the side surfaces of the through holes 120 and 130. Thus, the plating layer is formed on the recesses 13b and 13d and the center connection part 13c of the external connection portion 13 of the first lead 10 and the recesses 22b and 22d and the center connection part 22c of the external connection portion 22 of each second lead 20.

FIG. 10 shows a lead frame 200 including a frame portion 201 and the clip 40 supported by the frame portion 201. The base material of the lead frame 200 includes, for example, copper (Cu). The clip 40 is connected to the frame portion 201 via tie bars 202.

The lead frame 200 is formed by machining a metal plate (copper plate) having a predetermined thickness. The metal plate is, for example, punched so that through holes 203 and 204 are formed in the metal plate to form the frame portion 201, the tie bars 202, and the clip 40. Then, for example, pressing is performed to form the element connector 41, the lead connectors 42, and the joint 43 of the clip 40. A plating layer is formed on the entire surface of the lead frame 200 by a plating process. In the lead frame 200, the tie bars 202 are cut along cutting lines L4 by a cutting process to separate the clip 40.

The lead frame 100, shown in FIG. 9, is connected to the semiconductor element 30 and the clip 40, shown in FIG. 5. Then, the encapsulation resin 50 (indicated by double-dashed lines) is formed in molds.

The frame connectors 111 and 113 and the tie bars 112 are cut by cutting along the cutting lines L1 to L3 to separate the semiconductor device 1.

FIG. 9 shows the lead frame 100 that is located in a region including the first lead 10 and the second leads 20 of a single semiconductor device. FIG. 10 shows the lead frame 200 that is located in a region including the clip 40 for a single semiconductor device. The lead frames 100 and 200 in these regions are arranged, for example, in a matrix, and multiple semiconductor devices 1 (first leads 10, second leads 20, clips 40, and encapsulation resins 50) are simultaneously formed.

Operation

The operation of the semiconductor device 1 will now be described.

A first referential example and a second referential example in relation to the present embodiment will now be described. In the description of the first referential example and the second referential example, the same reference characters are given to those members that are the same as the corresponding members of the semiconductor device 1.

Figure 11:
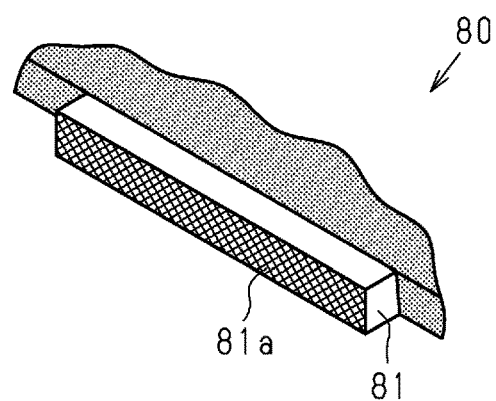
FIG. 11 is a partially perspective view of a semiconductor device showing a state of a first referential example of a lead.

FIG. 11 shows a portion of the first referential example of a semiconductor device 80.

The semiconductor device 80 shown in FIG. 11 includes a lead 81 having an end surface 81a, which is a cut surface that is cut through in the width-wise direction.

Figure 14:
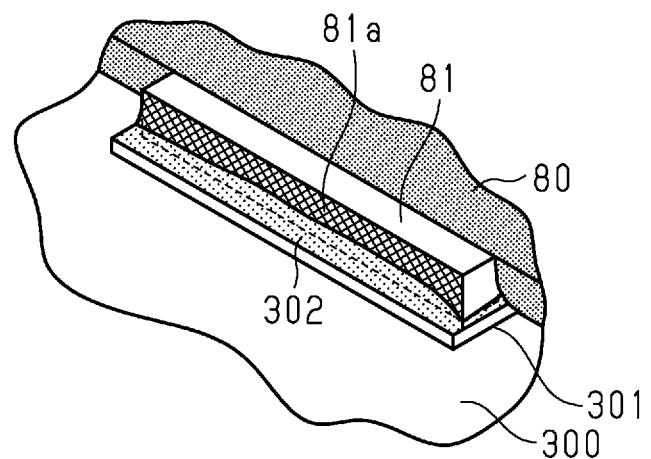
FIG. 14 is a perspective view showing a mount state of the lead of the first referential example.

As shown in FIG. 14, the semiconductor device 80 is mounted on a circuit board 300. The lead 81 of the semiconductor device 80 is connected to a pad 301 of the circuit board 300 by solder 302. In the case of the lead 81, the solder 302 has a low wettability to the end surface 81a, or the cut surface. Thus, the amount of the solder 302 adhered to the end surface 81a may be insufficient as compared to an amount needed to fix the semiconductor device 80. This lowers the mount strength. When the lead 81 is cut, the end surface 81a may be slightly covered with a plating layer from the surface of the lead 81 depending on the cutting direction of the lead 81. The solder 302 may adhere to the plating layer. However, the plating layer is so limited that the solder 302 is still insufficient and the mount strength is lowered.

Figure 12:
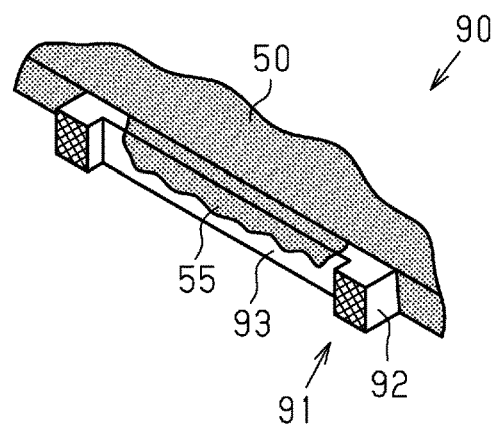
FIG. 12 is a partially perspective view of a semiconductor device showing a state of a second referential example of a lead.

FIG. 12 shows a portion of the second referential example of a semiconductor device 90.

Figure 15:
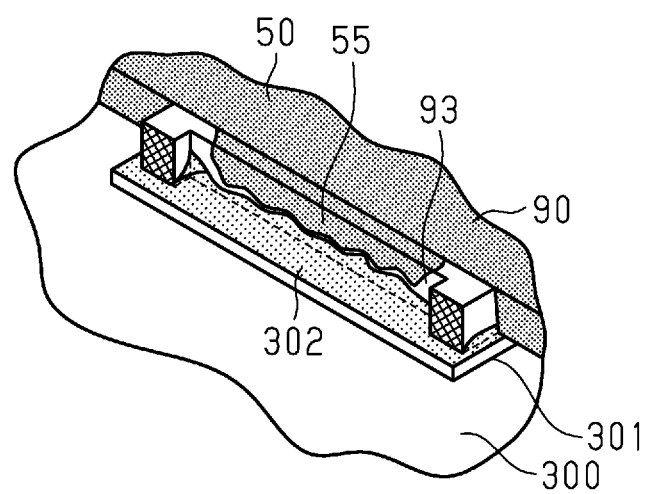
FIG. 15 is a perspective view showing a mount state of the lead of the second referential example.

The semiconductor device 90 shown in FIG. 12 includes a lead 91 that includes connection portions 92 located at opposite ends in the width-wise direction and a recess 93 located between the connection portions 92. The lead 91 is obtained by forming a through hole that extends through a part connected to the frame portion of the lead frame in the width-wise direction and cutting the part across the through hole. Because of the through hole, a plating layer is formed on a side surface of the recess 93. Thus, the wettability of solder is higher than that in the semiconductor device 80 shown in FIG. 11. However, when the encapsulation resin 50 is formed, a resin burr 55 is formed. When the encapsulation resin 50 is molded, the resin burr 55 is formed in a gap between a mold and the lead 91. A molten resin has properties that tend to flow to a center of the surface of the lead 91 in the width-wise direction of the lead 91 and relatively do not tend to flow to ends of the lead 91 in the width-wise direction. Thus, the resin burr 55 is likely to largely spread in the vicinity of the center of the lead 91. The resin burr 55 may partially cover the side surface of the recess 93. As a result, as shown in FIG. 15, when the semiconductor device 90 is mounted on the circuit board 300, the amount of the solder 302 adhered to the side surface of the recess 93 of the lead 91 may be insufficient as compared to an amount needed to fix the semiconductor device 90. This lowers the mount strength.

Figure 13:
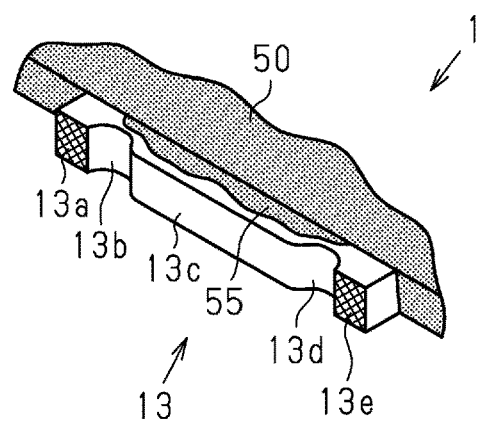
FIG. 13 is a partially perspective view of a semiconductor device showing a state of an embodiment of a lead.

FIG. 13 shows a portion of the semiconductor device 1 of the present embodiment.

In the semiconductor device 1 shown in FIG. 13, the first lead 10 includes the recesses 13b and 13d at positions toward the center from opposite ends in the width-wise direction. Because of the recesses 13b and 13d, the external connection portion 13 includes the end connection parts 13a and 13e located at opposite ends in the width-wise direction, the recesses 13b and 13d located toward the center from the end connection parts 13a and 13e, and the center connection part 13c located between the recesses 13b and 13d.

As described above, the widths of the end connection parts 13a and 13e are less than half (½) of the width of the center connection part 13c. With such a configuration, in which the center connection part 13c has a greater width and the recesses 13b and 13d are arranged at opposite ends of the external connection portion 13, when the encapsulation resin 50 is formed, the resin burr 55 remains on the upper surface of the center connection part 13c and will not easily cover the side surface of the center connection part 13c. Additionally, the depths of the recesses 13b and 13d are approximately half of the dimension of the external connection portion 13. If the recesses 13b and 13d are too deep, the resin burr 55 is readily formed. If the recesses 13b and 13d are too shallow, the wettability of solder may be lowered. Therefore, sufficient solder adheres to the external connection portion 13 (center connection part 13c and recesses 13b and 13d) when mounted on the circuit board. This increases the soldering strength and improves the strength of mounting on the circuit board.

Figure 16A:
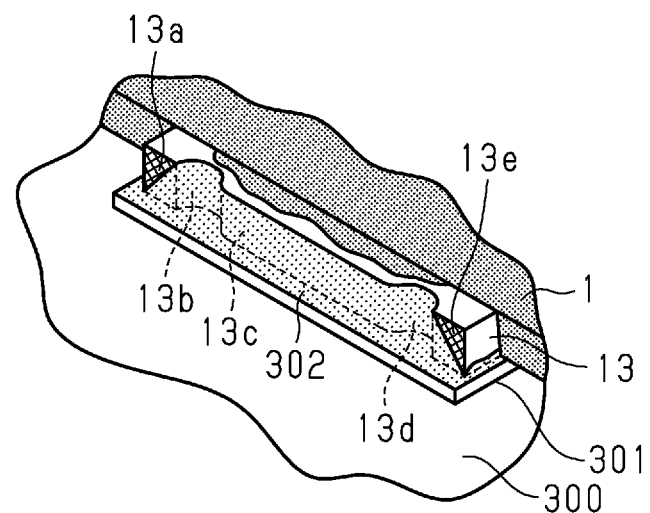
FIG. 16A is a perspective view showing a mount state of the lead of the embodiment.
Figure 16B:
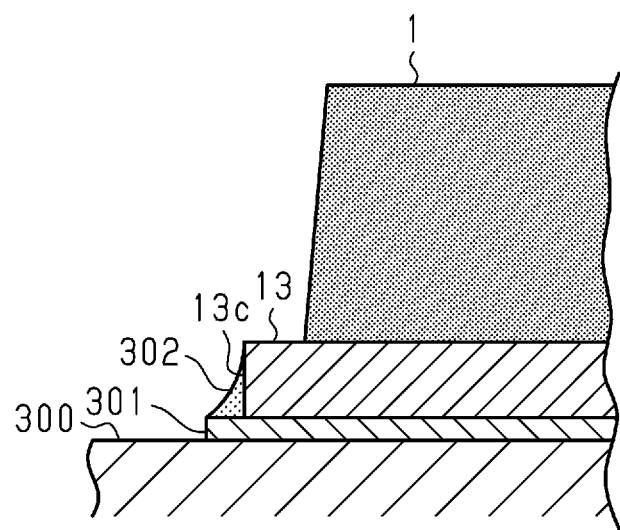
FIG. 16B is a cross-sectional view showing a mount state of the lead of the embodiment.
Figure 17A:
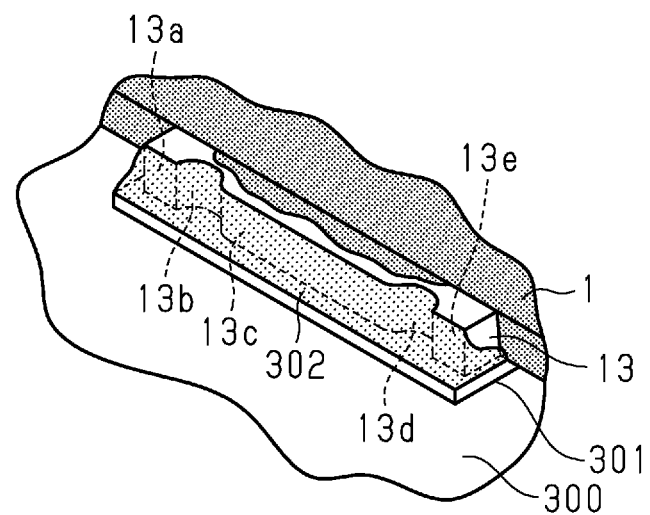
FIG. 17A is perspective view showing a mount state of the lead of the embodiment.
Figure 17B:
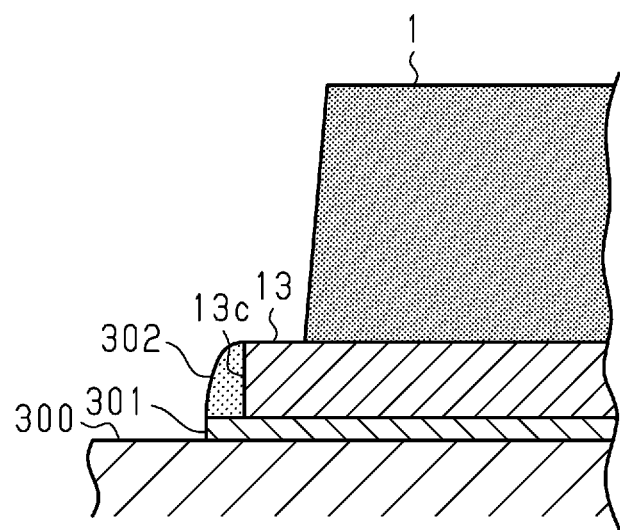
FIG. 17B is a cross-sectional view showing a mount state of the lead of the embodiment.

In the external connection portion 13, the plating layer is formed on the side surfaces of the recesses 13b and 13d and the side surface of the center connection part 13c. Thus, the wettability of solder is satisfactory. Thus, as shown in FIGS. 16A and 16B, when the semiconductor device 1 is mounted on the circuit board 300, the solder 302 sufficiently adheres to the external connection portion 13 (center connection part 13c and recesses 13b and 13d). This increases the strength of soldering on the pad 301 of the circuit board 300 and improves the strength of mounting on the circuit board 300. Further, as shown in FIGS. 17A and 17B, when the amount of the solder 302 is increased, the solder 302 adheres to front surfaces of the end connection parts 13a and 13e of the external connection portion 13. This further improves the strength of mounting on the circuit board 300.

The external connection portions 22 of the second leads 20 are formed in the same manner as the external connection portion 13 of the first lead 10. Thus, in the second leads 20, the strength of mounting on the circuit board is improved in the same manner as the first lead 10.

As shown in FIGS. 5 and 6, the lead connectors 42 of the clip 40 are arranged in the connection recesses 23 of the second leads 20. Each lead connector 42 is shaped as a rectangular plate. The lead connector 42 is opposed to the first restriction surface 23a and the second restriction surfaces 23b and 23c defining the connection recess 23. The lead connectors 42 are connected to the connection recesses 23 by the solder 73.

The solder 73 is molten in a reflow process. The lead connectors 42 are arranged in the connection recesses 23 of the second leads 20. Thus, when the solder 73 is molten, the second restriction surfaces 23b and 23c of the connection recesses 23 restrict movement of the lead connectors 42 (movement in a direction in which the second leads 20 are arranged or in a direction orthogonal to the second restriction surfaces 23b and 23c). This limits misalignment of the lead connectors 42 relative to the connection recesses 23, that is, displacement in a direction the second leads 20 are arranged (sideward direction in FIG. 5).

During soldering, the lead connectors 42 are moved toward the first restriction surfaces 23a by surface tension of the molten solder 73. The first restriction surfaces 23a restrict the movement of the lead connectors 42 (movement in a direction from the first lead 10 toward the second leads 20) caused by the molten solder 73. This limits misalignment of the lead connectors 42 relative to the connection recesses 23, that is, displacement in a direction orthogonal to the first restriction surfaces (vertical direction in FIG. 5).

The semiconductor device 1 includes the two second leads 20, and the electrode 31 arranged on the upper surface of the semiconductor element 30 is connected to the two second leads 20 by the clip 40. Thus, inclination of the clip 40 is limited. The inclination of the clip 40 may result in displacement of the element connector 41, that is, misalignment of the semiconductor element 30 relative to the element connector 41. In this regard, the two second leads 20 are provided, and the two second leads 20 are connected to the lead connectors 42 of the clip 40 to limit misalignment of the semiconductor element 30 with the element connector 41.

The lead connectors 42 of the clip 40 are each rectangular. The connection recess 23 of each second lead 20 is defined by the first restriction surface 23a and the second restriction surfaces 23b and 23c. The first restriction surface 23a is orthogonal to the second restriction surfaces 23b and 23c. The surface tension of the molten solder 73 allows each side of the lead connectors 42 to be arranged substantially parallel to the first restriction surface 23a and the second restriction surfaces 23b and 23c of the respective connection recesses 23. This limits inclination of the clip 40 relative to the second leads 20.

The semiconductor device 1 includes the two second leads 20, and the electrode 31 arranged on the upper surface of the semiconductor element 30 is connected to the two second leads 20 by the clip 40. Thus, only one of the two second leads 20 may be connected to a wire of the circuit board. This increases the degree of freedom for designing the circuit board.

As described above, the present embodiment has the advantages described below.

(1) The external connection portion 13 of the first lead 10 includes the recesses 13b and 13d in positions toward the center from opposite ends in the width-wise direction. Because of the recesses 13b and 13d, the external connection portion 13 includes the end connection parts 13a and 13e located at opposite ends in the width-wise direction, the recesses 13b and 13d located toward the center from the end connection parts 13a and 13e, and the center connection part 13c located between the recesses 13b and 13d. When the encapsulation resin 50 is formed, the resin burr 55 remains on the upper surface of the center connection part 13c and will not cover the side surface of the center connection part 13c. Thus, when mounting on the circuit board, sufficient solder adheres to the external connection portion 13 (center connection part 13c and recesses 13b and 13d). This increases the soldering strength and improves the strength of mounting on the circuit board.

The external connection portions 22 of the second leads 20 are formed in the same manner as the external connection portion 13 of the first lead 10. Thus, in the second leads 20, the strength of mounting on the circuit board is improved in the same manner as the first lead 10.

(2) The plating layer is formed on the side surfaces of the recesses 13b and 13d and the side surface of the center connection part 13c. Thus, the wettability of solder is satisfactory. Thus, when mounting on the circuit board, sufficient solder adheres to the external connection portion 13 (center connection part 13c and recesses 13b and 13d). This increases the soldering strength and improves the strength of mounting on the circuit board.

The external connection portions 22 of the second leads 20 are formed in the same manner as the external connection portion 13 of the first lead 10. Thus, in the second leads 20, the strength of mounting on the circuit board is improved in the same manner as the first lead 10.

(3) Each second lead 20 includes the connection recess 23, and the connection recess 23 is defined by the first restriction surface 23a and the second restriction surfaces that are orthogonal to the first restriction surface 23a. The lead connectors 42 of the clip 40 are connected to the connection recesses 23 by the solder 73. The first restriction surfaces 23a and the second restriction surfaces 23b and 23c of the connection recesses 23 restrict movement of the lead connectors 42 in directions corresponding to each surface. Thus, misalignment of the clip 40 relative to the second leads 20 is limited. The misalignment of the clip 40 may result in misalignment of the element connector 41 of the clip 40 with the semiconductor element 30. Thus, misalignment of the semiconductor element 30 relative to the element connector 41 of the clip 40 is limited. This obtains stable electrical connection between the semiconductor element 30 and the second leads 20.

Modified Examples

The embodiment may be modified as follows.

The semiconductor device 1 of the present embodiment includes the two second leads 20, and each of the two second leads 20 includes the connection recess 23. Thus, the semiconductor device 1 of the present embodiment includes two pairs of second restriction surfaces 23b and 23c. Instead, one pair of second restriction surfaces 23b and 23c may be used. For example, in FIG. 5, the second restriction surface 23b (or second restriction surface 23c) is omitted from the left one of the second leads 20, and the second restriction surface 23c (or second restriction surface 23b) is omitted from the right one of the second leads 20. Alternatively, in FIG. 5, the second restriction surfaces 23b and 23c are omitted from the left one (right one) of the second leads 20. Even with such configurations, movement of the clip 40 is restricted.

In the embodiment, the shape of the clip 40 may be changed.

Figure 18:
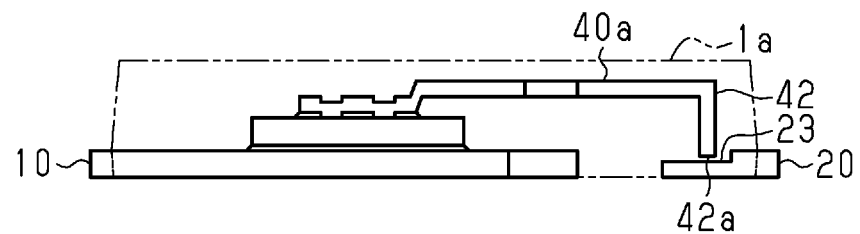
FIG. 18 is a schematic side view showing a modified example of a semiconductor device.

As shown in FIG. 18, a semiconductor device 1a includes a clip 40a that is bent so that the lead connector 42 has an end surface 42a contacting the connection recess 23 of the second lead 20. The end of the lead connector 42 is connected to the connection recess 23 of the second lead 20 by solder. In this case, the connection recess 23 of the second lead 20 may be open toward the first lead 10 in the same manner as in the embodiment or may be closed toward the first lead 10.

Figure 19:
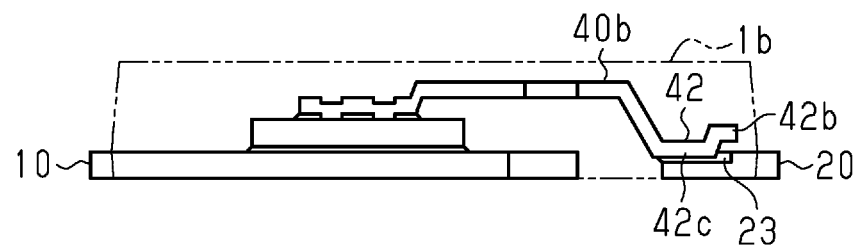
FIG. 19 is a schematic side view showing a modified example of a semiconductor device.

As shown in FIG. 19, a semiconductor device 1b includes a clip 40b in which the lead connector 42 includes an end portion 42b located closer to the external connection portion 22 than the connection recess 23 of the second lead 20. In the clip 40b, the lead connector 42 includes a portion 42c located closer to the element connector 41 than the end portion 42b, and the portion 42c is connected to the connection recess 23 of the second lead 20 by solder.

In the embodiment, the number of second leads 20 may be changed.

Figure 20:
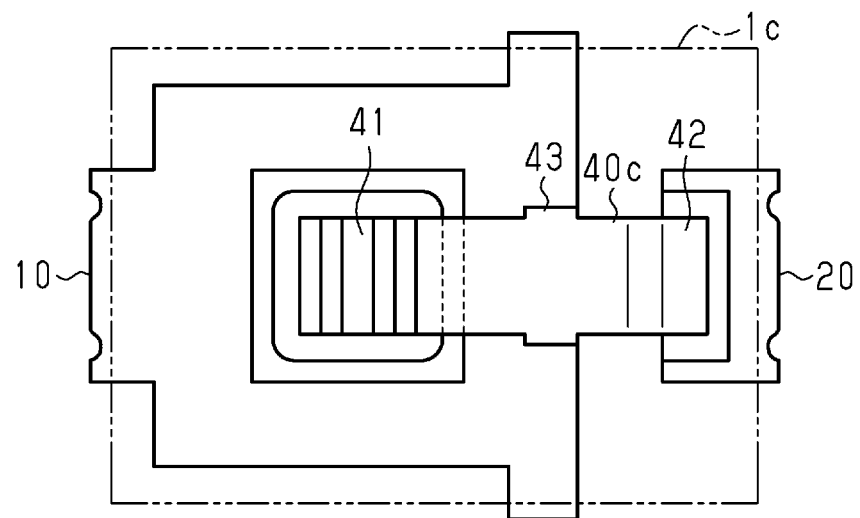
FIG. 20 is a schematic plan view showing a modified example of a semiconductor device.

As shown in FIG. 20, a semiconductor device 1c includes a single first lead 10 and a single second lead 20. A clip 40c includes an element connector 41 at one end, a lead connector 42 at the other end, and the joint 43 between the element connector 41 and the lead connector 42.

Figure 21:
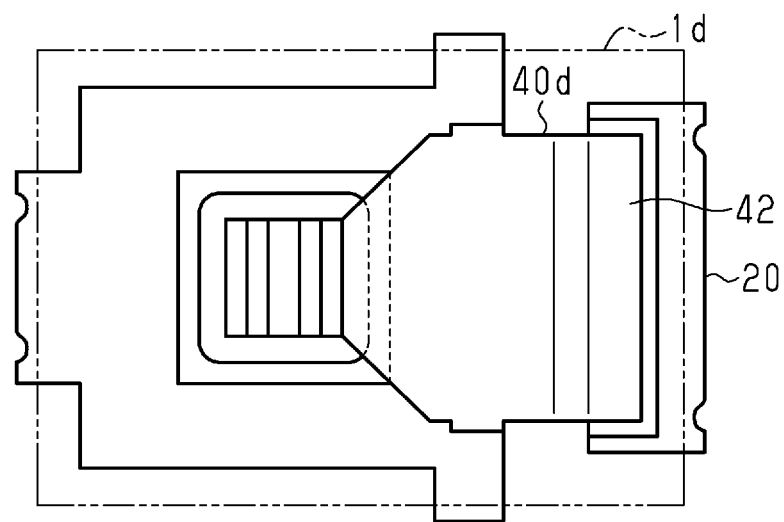
FIG. 21 is a schematic plan view showing a modified example of a semiconductor device.

As shown in FIG. 21, in a semiconductor device 1d, the width of the second lead 20 may be changed. Also, the width of the lead connector 42 of a clip 40d may be set in accordance with the width of the second lead 20.

In the embodiment, a semiconductor device may include a semiconductor element having an upper surface including two or more electrodes. The semiconductor device includes two or more second leads in accordance with the electrodes of the semiconductor element.

Figure 22:
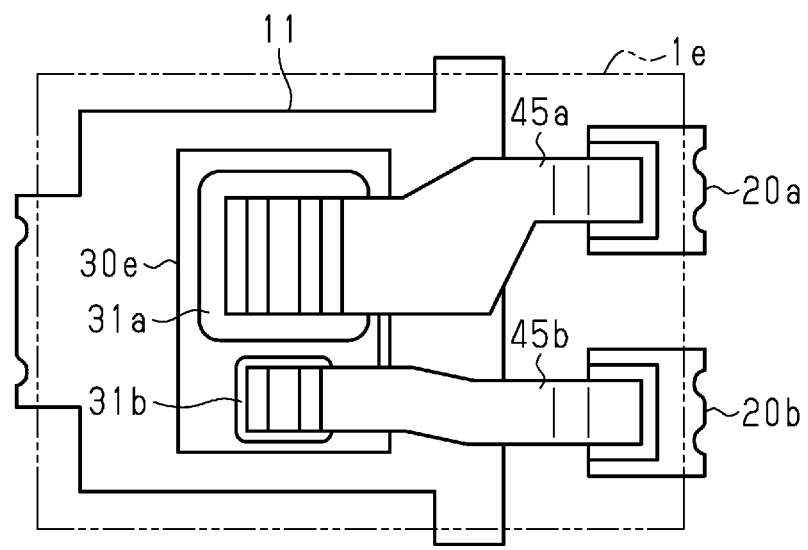
FIG. 22 is a schematic plan view showing a modified example of a semiconductor device.

FIG. 22 shows a semiconductor device 1e in which a semiconductor element 30e has an upper surface including two electrodes 31a and 31b and is mounted on the die pad 11. The semiconductor element 30e is, for example, a transistor. The electrode 31a is connected to a second lead 20a via a first connection plate 45a (clip), and the electrode 31b is connected to a second lead 20b via a second connection plate 45b (clip). The semiconductor element may be, for example, a diode having an upper surface including an anode electrode and a cathode electrode.

In the embodiment, the shapes of the external connection portions 13 and 22 may be changed.

Figure 23:
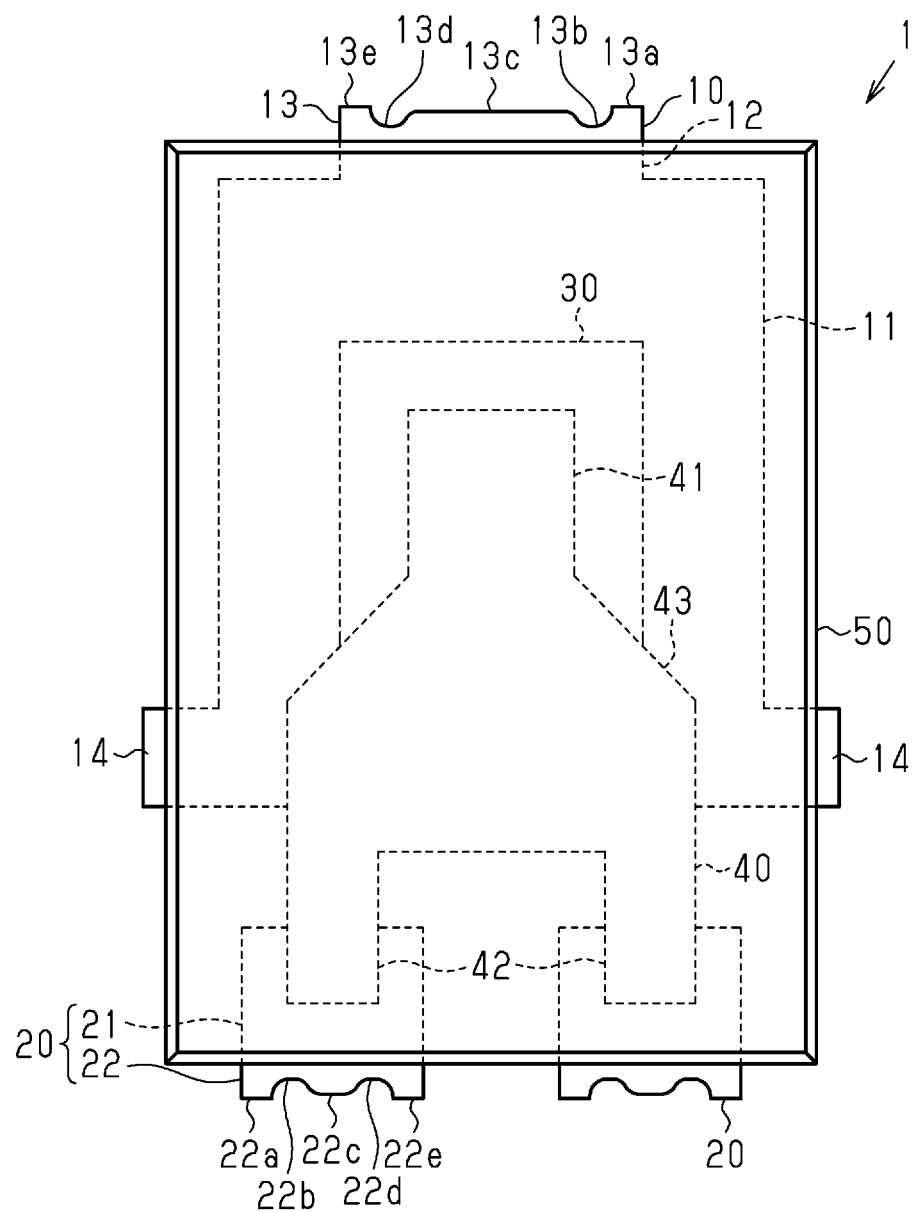
FIG. 23 is a schematic plan view showing a modified example of a semiconductor device.
Figure 24:
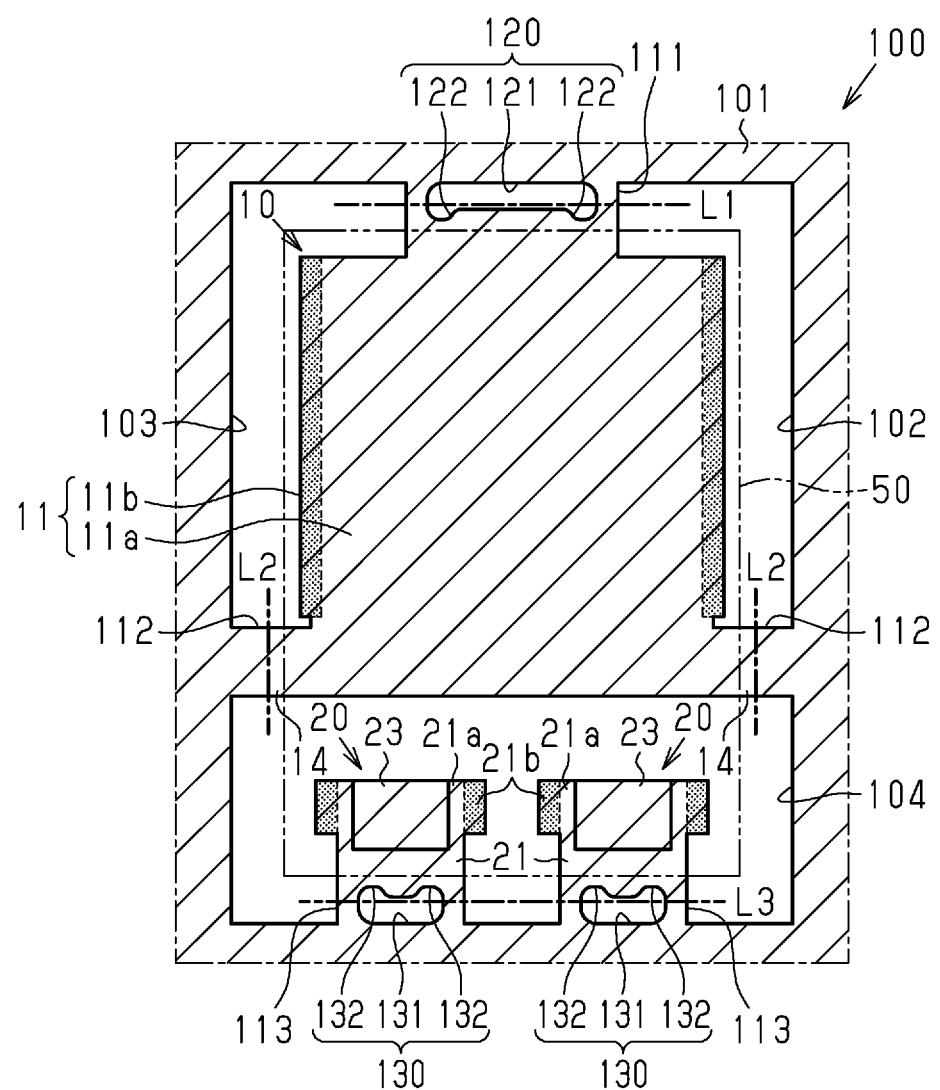
FIG. 24 is a partially plan view of a lead frame including a lead of the semiconductor device shown in FIG. 23.

As shown in FIG. 23, in the external connection portion 13, the end connection parts 13a and 13e may project more than the end surface of the center connection part 13c. As shown in FIG. 24, in a process of cutting the frame connector 111 along the cutting line L1, the frame connector 111 is cut so that the end connection parts 13a and 13e project more than the end surface of the center connection part 13c. The amount of the end connection parts 13a and 13e projecting from the end surface of the center connection part 13c may be changed by adjusting the position of the cutting line L1.

In the same manner, as shown in FIG. 23, in the external connection portion 22, the end connection parts 22a and 22e may project more than the end surface of the center connection part 22c. As shown in FIG. 24, in a process of cutting the frame connectors 113 along the cutting line L3, the frame connectors 113 are cut so that the end connection parts 22a and 22e project from the end surface of the center connection part 22c. The amount of the end connection parts 22a and 22e projecting from the end surface of the center connection part 22c may be changed by adjusting the position of the cutting line L3.

In the embodiment, the semiconductor element 30 and the second leads 20 are connected by the clip 40 (connection plate). Instead, a wire may be used for connection. When a wire is used, the wire may be connected to the connection recesses 23 of the second leads 20. The connection recesses 23 may be omitted from the second leads 20.

What is claimed is:

1. A semiconductor device, comprising:
   a semiconductor element;
   leads; and
   an encapsulation resin covering a portion of each of the leads and the semiconductor element, wherein
   each of the leads includes an external connection portion projecting from a side surface of the encapsulation resin,
   the external connection portion of at least one of the leads has opposite ends in a width-wise direction that extends along the side surface of the encapsulation resin,
   the external connection portion includes two recesses arranged toward a center in the width-wise direction from the opposite ends,
   the two recesses extend from a distal surface of the external connection portion toward the encapsulation resin,
   the opposite ends in the width-wise direction define an end connection part,
   the external connection portion includes a part between the two recesses defining a center connection part, and
   an entire portion of each of the recesses is exposed from the encapsulation resin.

2. The semiconductor device according to claim 1, wherein at least a portion of an end surface of the end connection part is free of a plating layer.

3. The semiconductor device according to claim 1, wherein the end connection part projects more than an end surface of the center connection part.

4. The semiconductor device according to claim 1, wherein each of the recesses has a depth from the distal surface to a bottom in a direction from the distal surface of the external connection portion toward the encapsulation resin, and the depth of each of the recesses is shorter than a length of the external connection portion from the distal surface of the external connection portion to the encapsulation resin.

5. A semiconductor device, comprising:
a semiconductor element;
leads; and
an encapsulation resin covering a portion of each of the leads and the semiconductor element, wherein
each of the leads includes an external connection portion projecting from a side surface of the encapsulation resin,
the external connection portion of at least one of the leads has opposite ends in a width-wise direction that extends along the side surface of the encapsulation resin,
the external connection portion includes two recesses arranged toward a center in the width-wise direction from the opposite ends,
the two recesses extend from a distal surface of the external connection portion toward the encapsulation resin,
the opposite ends in the width-wise direction define an end connection part,
the external connection portion includes a part between the two recesses defining a center connection part, and
the semiconductor device further comprises a plating layer covering a wall surface of the recesses and an end surface of the center connection part.

6. A method for producing a semiconductor device that encapsulates a semiconductor element and a portion of each of leads with a resin, the method comprising steps of:
preparing a lead frame that form the leads;
forming an encapsulation resin covering a portion of each of the leads and a semiconductor element mounted on the lead frame; and
forming an external connection portion that projects from a side surface of the encapsulation resin by cutting the leads, wherein
the leads are connected to a frame portion of the lead frame by a frame connector that forms the external connection portion,
the frame connector includes a first through hole extending in a width-wise direction and second through holes extending from opposite ends of the first through hole away from the frame portion, and
in the forming an external connection portion, the frame connector is cut across the first through hole so that the external connection portion is formed to have opposite ends in a width-wise direction that extends along a side surface of the encapsulation resin and include two recesses, the two recesses being arranged toward a center in the width-wise direction from the opposite ends and extending from a distal surface of the external connection portion toward the encapsulation resin, the opposite ends of the external connection portion in the width-wise direction define an end connection part, and the external connection portion includes a part between the two recesses defining a center connection part.

7. The method according to claim 6, wherein a plating layer is formed on a surface of the lead frame including the first through hole and the second through holes.

8. The method according to claim 6, wherein in the forming an external connection portion, the external connection portion is cut so that the end connection part projects more than an end surface of the center connection part.

9. A semiconductor device, comprising:
a first lead including a die pad and an external connection portion;
a second lead including an internal connection portion and an external connection portion;
a semiconductor element mounted on the die pad; and
a connection plate electrically connecting the semiconductor element and the second lead, wherein
the connection plate includes an element connector connected to the semiconductor element, a lead connector connected to the second lead, and a joint joining the element connector and the lead connector,
the second lead includes a restriction portion connected to the lead connector and including restriction surfaces, and
the restriction portion restricts movement of the connection plate with the restriction surfaces.

10. The semiconductor device according to claim 9, wherein the restriction surfaces include a first restriction surface opposed to the lead connector and a second restriction surface opposed to the lead connector and orthogonal to the first restriction surface.

11. The semiconductor device according to claim 10, wherein the first restriction surface faces toward the die pad.

12. The semiconductor device according to claim 10, wherein the second restriction surface is one of two second restriction surfaces opposed to each other, and
the restriction portion includes the two second restriction surfaces.

13. The semiconductor device according to claim 9, wherein the restriction portion is a connection recess arranged in an upper surface of the second lead.

14. The semiconductor device according to claim 13, wherein the connection recess is open toward the first lead.

15. The semiconductor device according to claim 9, further comprising an encapsulation resin covering the die pad, the internal connection portion, the semiconductor element, and the connection plate.

16. The semiconductor device according to claim 15, wherein the first lead and the second lead are exposed from a lower surface of the encapsulation resin.

17. The semiconductor device according to claim 15, wherein
the second lead is one of second leads, and
the second leads are arranged along a side surface of the encapsulation resin.

18. The semiconductor device according to claim 9, wherein
a semiconductor element is mounted on the die pad,
the die pad is tetragonal,
the second lead is one of two second leads,
the two second leads are arranged along a side of the die pad opposite to a side of the external connection portion,
the lead connector is one of two lead connectors,
the connection plate includes the element connector connected to the semiconductor element and the two lead connectors respectively connected to the two second leads, and
the joint joins the element connector and the two lead connectors.

19. The semiconductor device according to claim 9, wherein
a semiconductor element having an upper surface including two electrodes is mounted on the die pad, the die pad is tetragonal, the second lead is one of two second leads, the two second leads are arranged along a side of the die pad opposite to a side of the external connection portion, and the connection plate includes a first connection plate connecting one of the two electrodes of the semiconductor element and one of the two second leads and a second connection plate connecting the other one of the two electrodes of the semiconductor element and the other one of the two second leads.

20. The semiconductor device according to claim 9, wherein the external connection portion of the first lead and the external connection portion of the second lead include an external connection portion projecting from a side surface of an encapsulation resin, the external connection portion of at least one of the first lead and the second lead has opposite ends in a width-wise direction that extends along the side surface of the encapsulation resin, the external connection portion includes two recesses arranged toward a center in the width-wise direction from the opposite ends, the two recesses extend from a distal surface of the external connection portion toward the encapsulation resin, the opposite ends in the width-wise direction define an end connection part, and the external connection portion includes a part between the two recesses defining a center connection part.

21. The semiconductor device according to claim 20, further comprising a plating layer covering a wall surface of the recesses and an end surface of the center connection part.

22. The semiconductor device according to claim 20, wherein at least a portion of an end surface of the end connection part is free of a plating layer.

23. The semiconductor device according to claim 20, wherein the end connection part projects more than an end surface of the center connection part.

* * * * *